(12) United States Patent
Chang

(10) Patent No.: US 7,061,005 B2
(45) Date of Patent: Jun. 13, 2006

(54) PHASE-CHANGE RANDOM ACCESS MEMORY DEVICE AND METHOD FOR MANUFACTURING THE SAME

(75) Inventor: Heon Yong Chang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 50 days.

(21) Appl. No.: 10/999,330

(22) Filed: Nov. 30, 2004

(65) Prior Publication Data

US 2006/0001017 A1   Jan. 5, 2006

(30) Foreign Application Priority Data

Jun. 30, 2004   (KR) .......................... 10-2004-50134

(51) Int. Cl.
*H01L 47/00* (2006.01)
(52) U.S. Cl. .................................. 257/3; 257/2; 257/4
(58) Field of Classification Search .................. 257/3, 257/2, 4
See application file for complete search history.

(56) References Cited

U.S. PATENT DOCUMENTS 6,791,107 B1 * 9/2004 Gill et al. ..................... 257/20

* cited by examiner

*Primary Examiner*—Tu-Tu Ho
(74) *Attorney, Agent, or Firm*—Ladas & Parry LLP

(57) ABSTRACT

Disclosed are a phase-change random access memory device and a method for manufacturing the same by performing a photolithography process using electronic beam. The phase-change random access memory device includes a first insulation layer having first contact holes and a second contact hole, conductive plugs for filling the first contact holes, a bit line for filling the second contact hole, and a second insulation layer. A third insulation layer is formed on the second insulation layer. Third contact holes are formed in the third and second insulation layers. Fourth contact holes are formed between the hard mask layer and the third insulation layer. First and second bottom electrode contacts are provided to fill the third and fourth contact holes. Bottom electrodes are formed on the third insulation layer.

7 Claims, 5 Drawing Sheets

PHASE-CHANGE RANDOM ACCESS MEMORY DEVICE AND METHOD FOR MANUFACTURING THE SAME

BACKGROUND OF THE INVENTION

1. Field of the Invention

The present invention relates to a semiconductor memory device, and more particularly to a phase-change random access memory device and a method for manufacturing the same, capable of lowering writing current required for phase-changing a phase-change layer by reducing a contact area between a bottom electrode and the phase-change layer through performing a photolithography process using electronic beam (E-beam).

2. Description of the Prior Art

Semiconductor devices are mainly classified into RAM (random access memory) devices, such as DRAM (dynamic random access memory) devices and SRAM (static random access memory) devices, and ROM (read only memory) devices. The RAM devices have volatile characteristics so that data stored therein are automatically erased as time goes by. In addition, the RAM devices may allow data to be inputted thereto or outputted therefrom at a high speed. The ROM (read only memory) devices can store data in permanent while allowing data to be inputted thereto or outputted therefrom at a low speed. Such memory devices may represent logic "0" or logic "1" depending on charges stored therein.

Herein, the DRAM device, which is a volatile memory device, is unable to retain data unless a refresh voltage is periodically applied thereto, so it requires higher charge storage capacity. For this reason, various attempts have been carried out in order to enlarge a surface area of a capacitor electrode. However, if the surface area of the capacitor electrode becomes enlarged, there is a difficulty to increase an integration degree of the DRAM device.

In the meantime, a non-volatile memory device has a greater amount of charge storage capacity. Recently, demands for flash memory devices, such as EEPROM (electrically erasable and programmable ROM) devices, allowing data to be electrically inputted/outputted have been being increased.

Such a flash memory cell generally has a vertical-stack type gate structure including a floating gate formed on a silicon substrate. Typically, A multi gate structure includes at least one tunnel oxide layer or at least one dielectric layer, and a control gate formed at an upper portion or a peripheral portion of the floating gate. Writing or erasing of data in the flash memory cell can be achieved by allowing charges to pass through the tunnel oxide layer. At this time, an operation voltage must be higher than a supply voltage. For this reason, the flash memory devices must be equipped with booster circuits so as to generate voltages required for writing or erasing the data.

Thus, there have been various attempts to develop new memory devices having non-volatile and random access characteristics and capable of increasing the integration degree thereof with a simple structure. One of such new memory devices is a phase-change random access memory (PRAM) device.

The phase-change random access memory device employs a chalcogenide layer as a phase-change layer. The chalcogenide layer is a compound layer including Ge, Sb and Te (hereinafter, referred to as a "GST layer"). The GST layer is electrically switched between an amorphous state and a crystalline state according to current applied thereto, that is, Joule heat applied thereto.

FIG. 1 is a graph for explaining a method of programming or erasing data in a phase-change random access memory device, in which a transverse axis represents a time and a longitudinal axis represents a temperature applied to a phase-change layer.

As shown in FIG. 1, if the phase-change layer is rapidly quenched after the phase-change layer has been heated at a first predetermined temperature higher than a melting temperature (Tm) for a first period of time ($t_1$: first operation period), the phase-change layer is changed into an amorphous state (see, curve 'A'). In contrast, if the phase-change layer is quenched after the phase-change layer has been heated at a second predetermined temperature lower than the melting temperature (Tm) and higher than a crystallization temperature (Tc) for a second predetermined period of time ($t_2$: second operation period) longer than the first operation period $t_1$, the phase-change layer is changed into a crystalline state (see, curve 'B').

Herein, resistivity of the phase-change layer having the amorphous state is higher than that of the phase-change layer having the crystalline state. Therefore, it is possible to determine whether information stored in the phase-change random access memory cell is logic "1" or logic "0" by detecting current applied to the phase-change layer in a read mode.

As mentioned above, Joule heat is necessary in order to phase-change the phase-change layer. In a conventional phase-change random access memory device, if high density current is applied to a contact surface of the phase-change layer, the crystalline state of the contact surface of the phase-change layer may be changed. At this time, it is noted that current density required for phase-changing the phase-change layer becomes lowered as the contact surface of the phase-change layer becomes reduced.

FIG. 2 is a sectional view for explaining a conventional phase-change random access memory device.

As shown in FIG. 2, the conventional phase-change random access memory device includes a semiconductor substrate 10 formed with a bottom electrode 11, a first insulation layer 12 formed on the bottom electrode 11 and having a first contact hole 13 for exposing a predetermined portion of the bottom electrode 11, a bottom electrode contact 14 for filling the first contact hole 13, a second insulation layer 15 formed on the first insulation layer 12 including the bottom electrode contact 14 and having a second contact hole 16 for exposing the bottom electrode contact 14, a phase-change layer 17 for filling the second contact hole 16, and a top electrode 18 formed on the second insulation layer 15 including the phase-change layer 17.

In such a conventional phase-change random access memory device, if current is applied between the bottom electrode 11 and the top electrode 18, the crystalline state of the phase-change layer 17 is changed at a contact surface 19 according to current intensity (that is, heat) applied to the contact surface 19 formed between the bottom electrode contact 14 and the phase-change layer 17. At this time, heat required for phase-changing the phase-change layer 17 may directly relate to the contact surface 19 formed between the bottom electrode contact 14 and the phase-change layer 17. Accordingly, it is necessary to minimize the size of the contact surface 19, if possible.

However, in the above conventional phase-change random access memory device, the bottom electrode 11 is connected to the phase-change layer 17 through the bottom electrode contact 14. Accordingly, the size of the contact surface between the bottom electrode contact 14 and the phase-change layer 17 is directly subject to a limitation of a photo process for the contact hole, so there is a difficulty to reduce the size of the contact surface. For this reason, it is difficult to lower the writing current required for phase-changing the phase-change layer may increase.

SUMMARY OF THE INVENTION

Accordingly, the present invention has been made to solve the above-mentioned problems occurring in the prior art, and an object of the present invention is to provide a phase-change random access memory device and a method for manufacturing the same, capable of lowering writing current required for phase-changing a phase-change layer by reducing a contact area between a bottom electrode and the phase-change layer through performing a photolithography process using electronic beam (E-beam).

In order to accomplish the above object, according one aspect of the present invention, there is provided a phase-change random access memory device comprising: a first insulation layer formed on a semiconductor substrate including a predetermined bottom structure, the first insulation layer having first contact holes for exposing a predetermined portion of the semiconductor substrate and a second contact hole for exposing a predetermined portion of the semiconductor substrate formed between the first contact holes; conductive plugs for filling the first contact holes; a bit line formed on the first insulation layer in order to fill the second contact hole; a second insulation layer formed on the first insulation layer including the bit line; a top electrode, a phase-change layer pattern, and a hard mask layer, which are sequentially formed on a predetermined portion of the second insulation layer; a third insulation layer formed on the second insulation layer so as to cover both sidewalls of the top electrode, the phase-change layer pattern and the hard mask layer, while exposing an upper surface of the hard mask layer; third contact holes formed in the third and second insulation layers so as to expose the conductive plugs; fourth contact holes formed between the hard mask layer and the third insulation layer so as to expose both surfaces of the phase-change layer pattern; first and second bottom electrode contacts for filling the third and fourth contact holes, respectively; and bottom electrodes formed on the third insulation layer such that the bottom electrodes are connected to the first and second bottom electrode contacts, respectively.

According to the preferred embodiment of the present invention, the phase-change layer pattern includes a $GeSb_2Te_4$ layer or a $Ge_2Sb_2Te_5$ layer and the third insulation layer includes one selected from the group consisting of HDP, USG, SOG, PSG, BPSG, TEOS, and HLD oxide layers. In addition, the fourth contact hole has a diameter of equal to or less than 100 nm.

In order to accomplish the above object, according another aspect of the present invention, there is provided a method for manufacturing a phase-change random access memory device, the method comprising the steps of: forming a first insulation layer on a semiconductor substrate including a predetermined bottom structure, and selectively etching the first insulation layer so as to form first contact holes for exposing a predetermined portion of the semiconductor substrate; filling the first contact holes with a conductive layer, thereby forming conductive plugs; selectively etching the first insulation layer so as to form a second contact hole for exposing a predetermined portion of the semiconductor substrate formed between conductive plugs; forming a bit line on the first insulation layer in such a manner that the second contact hole is filled with the bit line; forming a second insulation layer on the first insulation layer including the bit line; sequentially forming a top electrode conductive layer, a phase-change layer and a hard mask layer on the second insulation layer, and selectively etching the top electrode conductive layer, the phase-change layer and the hard mask layer, thereby forming a top electrode, a phase-change layer pattern and a hard mask layer; forming a third insulation layer on an entire surface of a resultant structure and performing a chemical mechanical polishing process with respect to the third insulation layer until a surface of the hard mask layer is exposed; forming third contact holes for exposing the conductive plugs by selectively etching the third insulation layer and the second insulation layer; forming fourth contact holes for exposing both surfaces of the phase-change layer pattern by selectively etching the hard mask layer; forming first and second bottom electrode contacts for filling the third and fourth contact holes; and forming bottom electrodes connected to the first and second bottom electrode contacts on the third insulation layer.

According to the preferred embodiment of the present invention, the step of forming the bit line on the first insulation layer includes the substeps of depositing a metal layer on the first insulation layer including the second contact hole such that the second contact hole is filled with the metal layer, and pattering the metal layer. In addition, the fourth contact hole is formed such that the fourth contact hole has a diameter of equal to or less than 100 nm by performing a photolithography process using electronic beam.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described in detail with reference to accompanying drawings.

Figure 1:
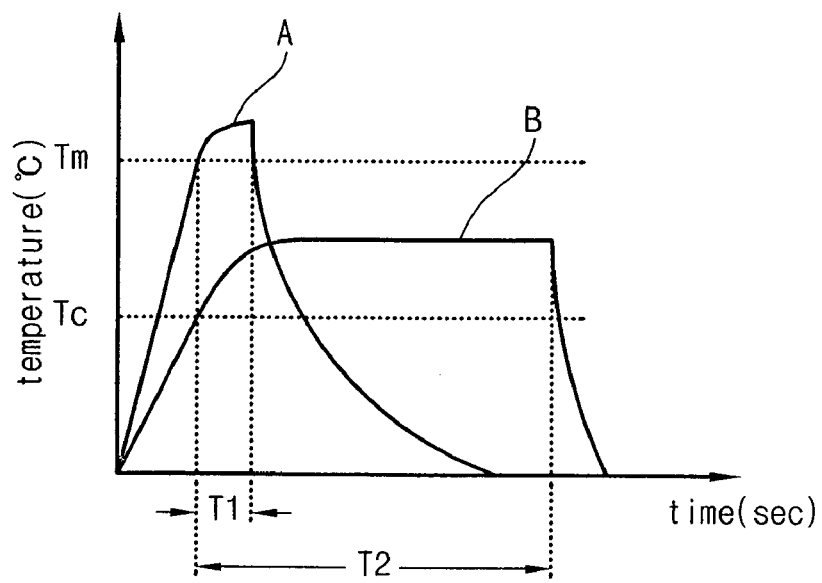
FIG. 1 is a graph for explaining a method of programming or erasing data in a phase-change random access memory device.
Figure 2:
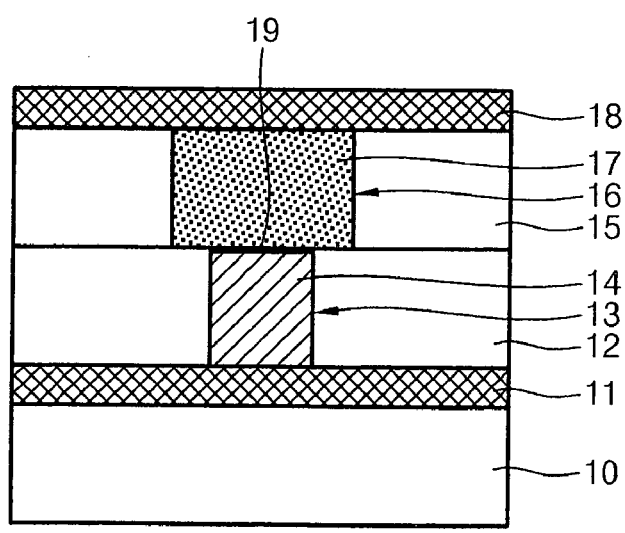
FIG. 2 is a sectional view for explaining a conventional phase-change random access memory device.
Figure 3:
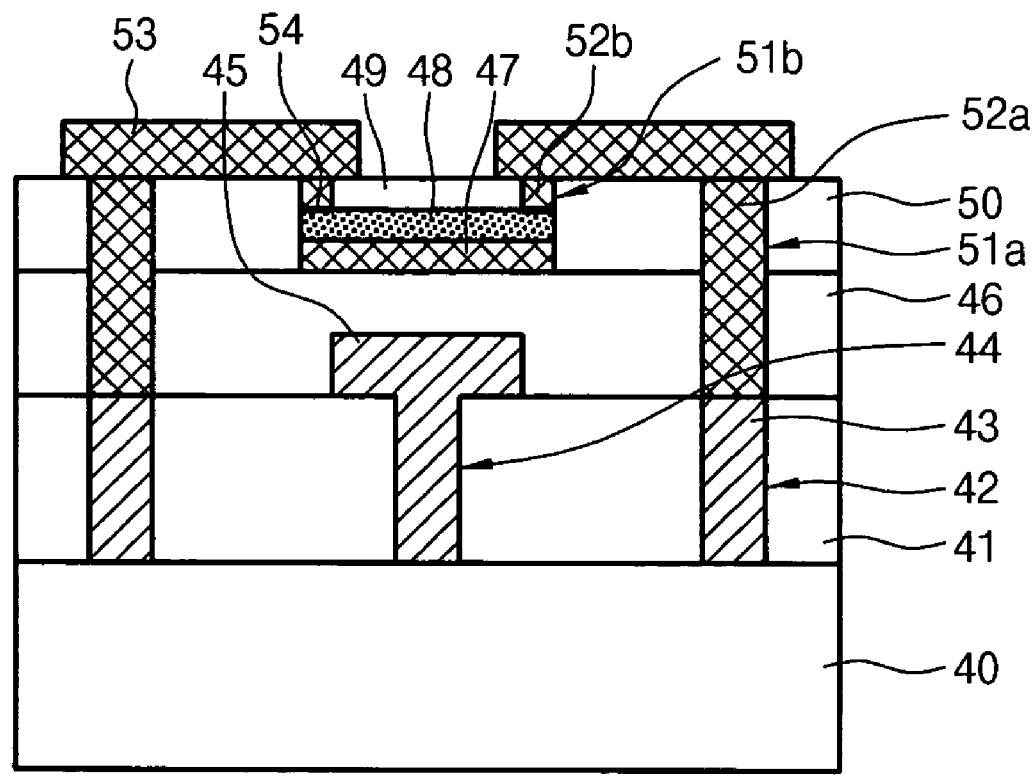
FIG. 3 is a sectional view for explaining a phase-change random access memory device according to one embodiment of the present invention.

FIG. 3 is a sectional view for explaining a phase-change random access memory device according to one embodiment of the present invention.

As shown in FIG. 3, the phase-change random access memory device according to one embodiment of the present invention includes a semiconductor substrate 40 having a predetermined bottom structure (not shown), a first insulation layer 41 formed on the semiconductor substrate 40 and having first contact holes 42 for exposing a predetermined portion of the semiconductor substrate 40 and a second contact hole 44 for exposing a predetermined portion of the semiconductor substrate 40 formed between the first contact holes 42, conductive plugs 43 for filling the first contact holes 42, a bit line 45 formed on the first insulation layer 41 in order to fill the second contact hole 44, and a second insulation layer 46 formed on the first insulation layer 41 including the bit line 45. A top electrode 47, a phase-change layer pattern 48 and a hard mask layer 49 are sequentially formed on a predetermined portion of the second insulation layer 46. The phase-change random access memory device also includes a third insulation layer 50 formed on the second insulation layer 46 so as to cover both sidewalls of the top electrode 47, the phase-change layer pattern 48 and the hard mask layer 49 while exposing an upper surface of the hard mask layer 49, third contact holes 51b formed in the third and second insulation layers 50 and 46 so as to expose the conductive plugs 43, fourth contact holes 51b formed between the hard mask layer 49 and the third insulation layer 50 so as to expose both surfaces of the phase-change layer pattern 48, first bottom electrode contacts 52a for filling the third contact holes 51a, second bottom electrode contacts 52b for filling the fourth contact holes 51b, and bottom electrodes 53 formed on the third insulation layer 50 such that they can be connected to the first and second bottom electrode contacts 52a and 52b, respectively.

Herein, the top electrode 47, the first and second bottom electrode contacts 52a and 52b, and the bottom electrodes 53 are made from polysilicon-based materials or metallic materials, and the phase-change layer pattern 48 is made from a GTS layer. At this timed, the GTS layer includes one selected from the group consisting of a $GeSb_2Te_4$ layer and a $Ge_2Sb_2Te_5$ layer. In addition, the third insulation layer 50 includes one selected from the group consisting of HDP, USG, SOG, PSG, BPSG, TEOS, and HLD oxide layers.

Each of the fourth contact holes 51b has a diameter of equal to or less than 100 nm. A contact surface 54 is formed between a lower surface of the second bottom electrode contact 52b and the phase-change layer pattern 48. If current is applied between the bottom electrode 53 and the top electrode 47, the phase of the phase-change layer pattern 48 may be changed at the contact surface 54. At this time, since the diameter of the contact surface 54 is identical to the diameter of the fourth contact hole 51b, the contact surface 54 also has a size of equal to or less than 100 nm. Thus, the wiring current required for phase-changing the phase-change layer pattern 48 also decreases.

In the meantime, since two bottom electrode contacts, that is, the first bottom electrode contact 52a connected to the conductive plug 43 and the second bottom electrode contact 52b connected to the phase-change layer pattern 48 and having a diameter of equal to or less than 100 nm are connected to the lower portion of the bottom electrode 53, the flow of current required for phase-changing the phase-change layer pattern 48 can be facilitated.

Hereinafter, a method for fabricating the phase-change random access memory device shown in FIG. 3 will be described in detail.

FIGS. 4a to 4f are sectional views for explaining the method for fabricating the phase-change random access memory device according to one embodiment of the present invention.

Figure 4A:
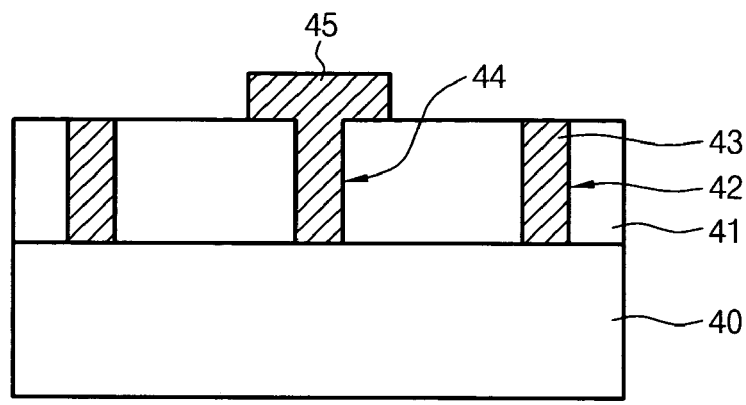
FIGS. 4a to 4f are sectional views for explaining a method for fabricating a phase-change random access memory device according to one embodiment of the present invention.

According to the method for fabricating the phase-change random access memory device of the present invention, as shown in FIG. 4a, the first insulation layer 41 is formed on the semiconductor substrate 40 including the predetermined bottom structure (not shown). Then, the first insulation layer 41 is selectively etched so as to form the first contact holes 42 for exposing a predetermined portion of the semiconductor substrate 40. In addition, the first contact holes 42 are filled with the conductive layer, thereby forming the conductive plugs 43.

Then, the first insulation layer 41 is selectively etched in such a manner that a predetermined portion of the semiconductor substrate formed between conductive plugs 43 is exposed, thereby forming the second contact hole 44. Subsequently, a metal layer is deposited on the first insulation layer 41 such that the second contact hole 44 is filled with the metal. Then, the bit line 45 is formed through pattering the metal layer.

Figure 4B:
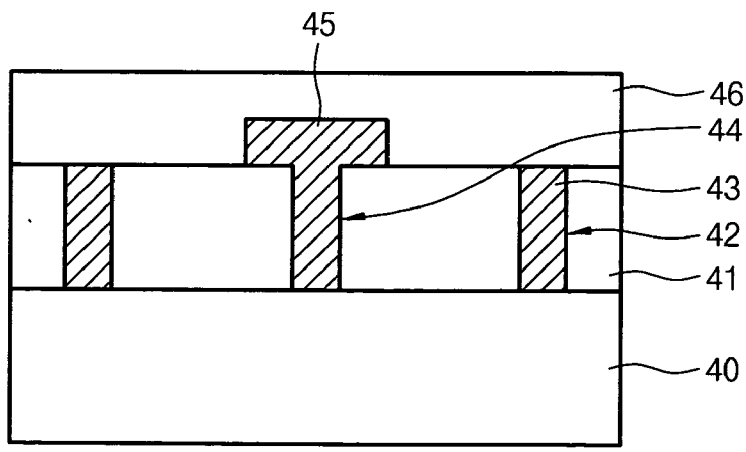

In addition, as shown in FIG. 4b, after forming the second insulation layer 46 on the first insulation layer 41 including the bit line 45, a chemical mechanical polishing (CMP) process is carried out with respect to the second insulation layer 46, thereby planarizing the second insulation layer 46.

Figure 4C:
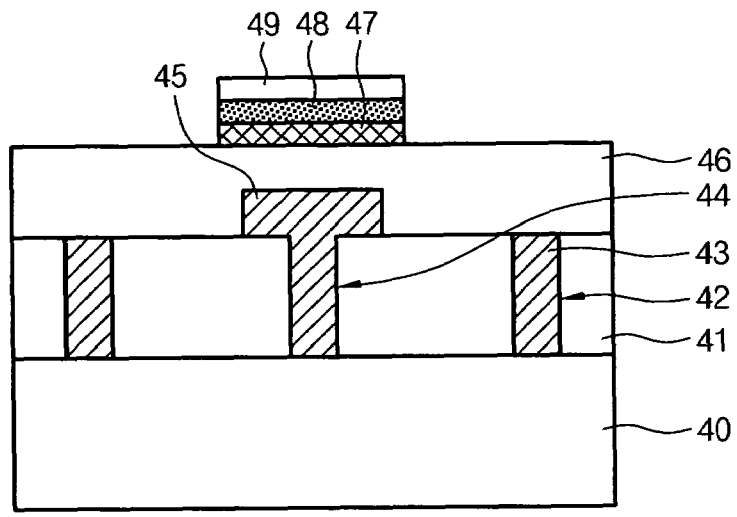

Then, as shown in FIG. 4c, the top electrode conductive layer (not shown), the phase-change layer (not shown), and the hard mask layer are sequentially formed on the planarized second insulation layer 46. Herein, as mentioned above, the top electrode conductive layer is made from polysilicon-based materials or metallic materials, and the phase-change layer includes the GTS layer. At this time, the GST layer includes one selected from the group consisting of a $GeSb_2Te_4$ layer or a $Ge_2Sb_2Te_5$ layer.

After that, the hard mask layer, the phase-change layer, and the top electrode conductive layer are selectively etched, thereby forming the top electrode 47, the phase-change layer pattern 48 and the hard mask layer 49, respectively.

Figure 4D:
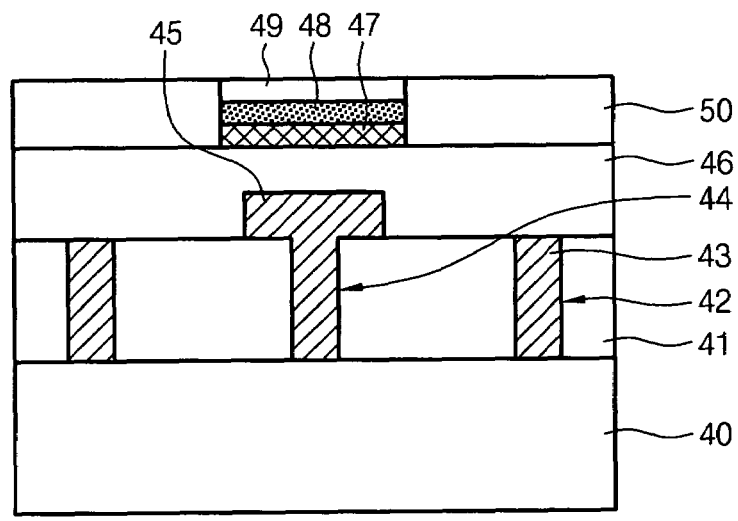

Then, as shown in FIG. 4d, after forming the third insulation layer 50 on an entire surface of the resultant structure, the CMP process is carried out with respect to the third insulation layer 50 until a surface of the hard mask layer 49 is exposed. As mentioned above, the third insulation layer 50 includes one selected from the group consisting of HDP, USG, SOG, PSG, BPSG, TEOS, and HLD oxide layers.

Figure 4E:
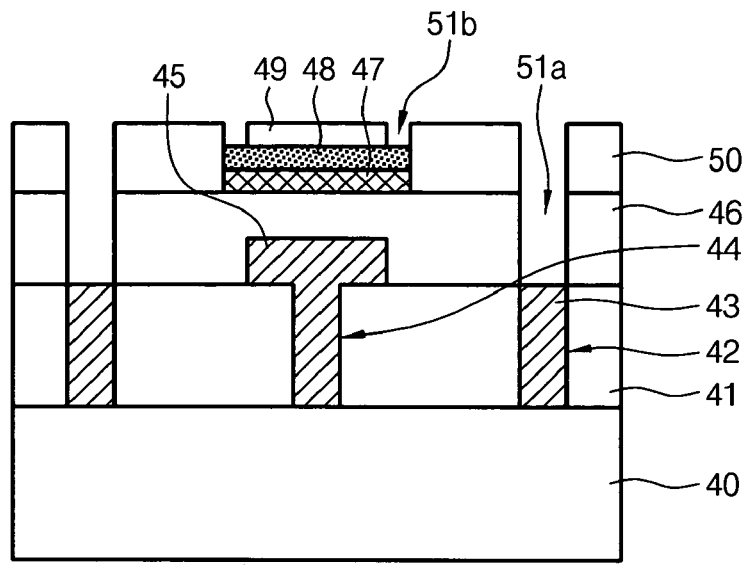

In addition, as shown in FIG. 4e, the third insulation layer 50 and the second insulation layer 46 are selectively etched, thereby forming the third contact holes 51a for exposing the conductive plugs 43. In this state, the hard mask layer 48 is selectively etched, thereby forming the fourth contact holes 51b for exposing both surfaces of the phase-change layer pattern 48. At this time, the fourth contact hole 51b has a diameter of equal to or less than 100 nm through the photolithography process using electronic beam (E-beam).

Figure 4F:
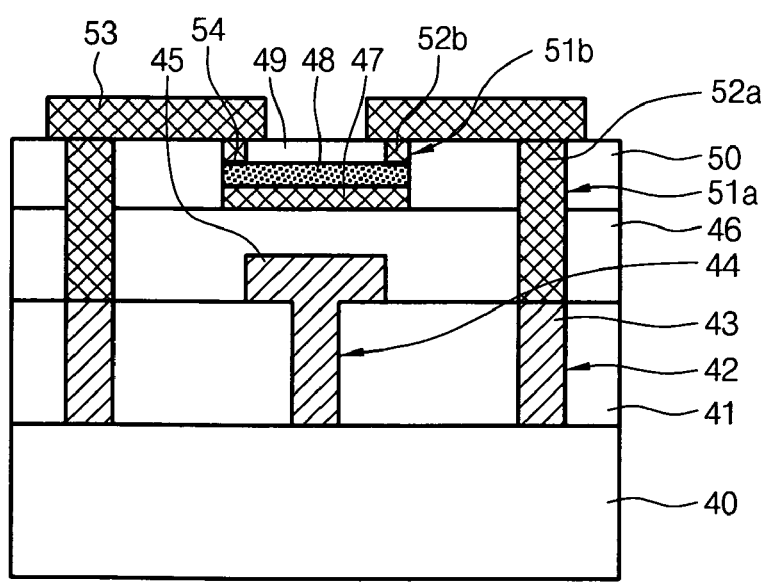

Subsequently, as shown in FIG. 4f, after forming the first and second bottom electrode contacts 52a and 52b for filling the third and fourth contact holes 51a and 51b, the bottom electrodes 53 connected to the first and second bottom electrode contacts 52a and 52b are formed on the third insulation layer 50. As mentioned above, the first and second bottom electrode contacts 52a and 52b and the bottom electrodes 53 are made from polysilicon-based materials or metallic materials.

In addition, the contact surface 54 is formed between a lower surface of the second bottom electrode contact 52b and the phase-change layer pattern 48. If current is applied between the bottom electrode 53 and the top electrode 47, the phase of the phase-change layer pattern 48 may be changed at the contact surface 54.

Herein, since the diameter of the contact surface 54 is equal to the diameter of the fourth contact hole 51b, the size of the contact surface 54 is equal to or less than 100 nm. Accordingly, the writing current required for phase-changing the phase-change layer pattern 48 can be reduced.

In addition, since two bottom electrode contacts, that is, the first bottom electrode contact 52*a* connected to the conductive plug 43 and the second bottom electrode contact 52*b* connected to the phase-change layer pattern 48 and having a diameter of equal to or less than 100 nm are connected to the lower portion of the bottom electrode 53, the flow of current required for phase-changing the phase-change layer pattern 48 can be facilitated.

As described above, according to the present invention, two bottom electrode contacts, that is, the first bottom electrode contact connected to the conductive plug and the second bottom electrode contact connected to the phase-change layer pattern and having a diameter of equal to or less than 100 nm are connected to the lower portion of the bottom electrode, so the flow of current required for phase-changing the phase-change layer pattern 48 can be facilitated. In particular, since the second bottom electrode contact connected to the phase-change layer pattern can be formed with a diameter of equal to or less than 100 nm through the photolithography process using E-beam, it is possible to lower the writing current required for phase-changing the phase-change layer pattern at the contact surface.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A phase-change random access memory device comprising:
   a first insulation layer formed on a semiconductor substrate including a predetermined bottom structure, the first insulation layer having first contact holes for exposing a predetermined portion of the semiconductor substrate and a second contact hole for exposing a predetermined portion of the semiconductor substrate formed between the first contact holes;
   conductive plugs for filling the first contact holes;
   a bit line formed on the first insulation layer in order to fill the second contact hole;
   a second insulation layer formed on the first insulation layer including the bit line;
   a top electrode, a phase-change layer pattern, and a hard mask layer, which are sequentially formed on a predetermined portion of the second insulation layer;
   a third insulation layer formed on the second insulation layer so as to cover both sidewalls of the top electrode, the phase-change layer pattern and the hard mask layer, while exposing an upper surface of the hard mask layer;
   third contact holes formed in the third and second insulation layers so as to expose the conductive plugs;
   fourth contact holes formed between the hard mask layer and the third insulation layer so as to expose both surfaces of the phase-change layer pattern;
   first and second bottom electrode contacts for filling the third and fourth contact holes, respectively; and
   bottom electrodes formed on the third insulation layer such that the bottom electrodes are connected to the first and second bottom electrode contacts, respectively.

2. The phase-change random access memory device as claimed in claim 1, wherein the phase-change layer pattern includes a $GeSb_2Te_4$ layer or a $Ge_2Sb_2Te_5$ layer.

3. The phase-change random access memory device as claimed in claim 1, wherein the third insulation layer includes one selected from the group consisting of HDP, USG, SOG, PSG, BPSG, TEOS, and HLD oxide layers.

4. The phase-change random access memory device as claimed in claim 1, wherein the fourth contact hole has a diameter of equal to or less than 100 nm.

5. A method for manufacturing a phase-change random access memory device, the method comprising the steps of:
   i) forming a first insulation layer on a semiconductor substrate including a predetermined bottom structure, and selectively etching the first insulation layer so as to form first contact holes for exposing a predetermined portion of the semiconductor substrate;
   ii) filling the first contact holes with a conductive layer, thereby forming conductive plugs;
   iii) selectively etching the first insulation layer so as to form a second contact hole for exposing a predetermined portion of the semiconductor substrate formed between conductive plugs;
   iv) forming a bit line on the first insulation layer in such a manner that the second contact hole is filled with the bit line;
   v) forming a second insulation layer on the first insulation layer including the bit line;
   vi) sequentially forming a top electrode conductive layer, a phase-change layer and a hard mask layer on the second insulation layer, and selectively etching the top electrode conductive layer, the phase-change layer and the hard mask layer, thereby forming a top electrode, a phase-change layer pattern and a hard mask layer;
   vii) forming a third insulation layer on an entire surface of a resultant structure and performing a chemical mechanical polishing process with respect to the third insulation layer until a surface of the hard mask layer is exposed;
   viii) forming third contact holes for exposing the conductive plugs by selectively etching the third insulation layer and the second insulation layer;
   ix) forming fourth contact holes for exposing both surfaces of the phase-change layer pattern by selectively etching the hard mask layer;
   x) forming first and second bottom electrode contacts for filling the third and fourth contact holes; and
   xi) forming bottom electrodes connected to the first and second bottom electrode contacts on the third insulation layer.

6. The method as claimed in claim 5, wherein the step of forming the bit line on the first insulation layer includes the substeps of depositing a metal layer on the first insulation layer including the second contact hole such that the second contact hole is filled with the metal layer, and pattering the metal layer.

7. The method as claimed in claim 5, wherein the fourth contact hole is formed such that the fourth contact hole has a diameter of equal to or less than 100 nm by performing a photolithography process using electronic beam.

* * * * *